United States Patent
McGrath

(10) Patent No.: US 12,218,643 B2
(45) Date of Patent: Feb. 4, 2025

(54) LOW LATENCY AUDIO FILTERBANK HAVING IMPROVED FREQUENCY RESOLUTION

(71) Applicant: Dolby Laboratories Licensing Corporation, San Francisco, CA (US)

(72) Inventor: David S. McGrath, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 80 days.

(21) Appl. No.: 17/617,262

(22) PCT Filed: Jun. 25, 2020

(86) PCT No.: PCT/US2020/039472
§ 371 (c)(1),
(2) Date: Dec. 7, 2021

(87) PCT Pub. No.: WO2020/264064
PCT Pub. Date: Dec. 30, 2020

(65) Prior Publication Data
US 2022/0231669 A1    Jul. 21, 2022

Related U.S. Application Data

(60) Provisional application No. 63/028,966, filed on May 22, 2020, provisional application No. 62/866,823, filed on Jun. 26, 2019.

(51) Int. Cl.
*H03H 17/02* (2006.01)
*G10L 19/008* (2013.01)

(52) U.S. Cl.
CPC ....... *H03H 17/0267* (2013.01); *G10L 19/008* (2013.01)

(58) Field of Classification Search
CPC ............ H03H 17/0267; H03H 17/0266; G10L 19/008
See application file for complete search history.

(56) References Cited

U.S. PATENT DOCUMENTS

| | | |
|---|---|---|
| 4,896,356 A | 1/1990 | Millar |
| 5,568,142 A | 10/1996 | Velazquez |
| (Continued) | | |

FOREIGN PATENT DOCUMENTS

| | | |
|---|---|---|
| AU | 2007308416 B2 | 7/2010 |
| CN | 100481722 C | 4/2009 |
| (Continued) | | |

OTHER PUBLICATIONS

Lollmann et al: "Uniform and warped low delay filter-banks for speech enhancement", Speech Communication, Elsevier Science Publishers, Amsterdam, NL, vol. 49, No. 7-8, Jul. 26, 2007 (Jul. 26, 2007), pp. 574-587.

(Continued)

*Primary Examiner* — Jason R Kurr

(57) ABSTRACT

A filterbank, suitable for modifying audio signals with dynamic gains in each band, is constructed so that the perceived latency is small, while a larger group delay is applied at low frequencies to enable higher frequency resolution in the lower frequency bands. The higher group delay at low frequencies is achieved by inserting an all-pass filter into the reconstructed filter response.

19 Claims, 11 Drawing Sheets

(56) References Cited

U.S. PATENT DOCUMENTS

| | | | |
|---|---|---|---|
| 5,825,311 | A | 10/1998 | Kataoka |
| 6,856,653 | B1 | 2/2005 | Taniguchi |
| 7,738,593 | B2 | 6/2010 | Howard |
| 8,081,764 | B2 | 12/2011 | Takagi |
| 8,121,311 | B2 | 2/2012 | Hetherington |
| 8,209,190 | B2 | 6/2012 | Ashley |
| 8,219,408 | B2 | 7/2012 | Ashley |
| 8,554,549 | B2 | 10/2013 | Oshikiri |
| 8,831,931 | B2 | 9/2014 | Kuntz |
| 8,867,753 | B2 | 10/2014 | Neusinger |
| 8,879,747 | B2 | 11/2014 | Christoph |
| 8,880,572 | B2 | 11/2014 | Ekstrand |
| 8,908,893 | B2 | 12/2014 | Alfsmann |
| 9,026,451 | B1 | 5/2015 | Kleijn |
| 9,084,049 | B2 | 7/2015 | Fielder |
| 9,191,766 | B2 | 11/2015 | Christoph |
| 9,226,089 | B2 | 12/2015 | Mundt |
| 9,269,360 | B2 | 2/2016 | McGrath |
| 9,319,791 | B2 * | 4/2016 | Kerner .................... H04R 3/04 |
| 9,449,608 | B2 * | 9/2016 | Ekstrand ................ G10L 21/00 |
| 9,496,850 | B2 | 11/2016 | Jot |
| 9,661,190 | B2 | 5/2017 | Zhang |
| 9,997,171 | B2 | 6/2018 | De Vries |
| 2003/0108214 | A1 | 6/2003 | Brennan |
| 2003/0142234 | A1 | 7/2003 | Dent |
| 2004/0254797 | A1 | 12/2004 | Niamut |
| 2007/0179781 | A1 | 8/2007 | Villemoes |
| 2007/0276656 | A1 | 11/2007 | Solbach |
| 2007/0288235 | A1 | 12/2007 | Vaananen |
| 2008/0175394 | A1 | 7/2008 | Goodwin |
| 2011/0103620 | A1 | 5/2011 | Strauss |
| 2013/0287225 | A1 | 10/2013 | Niwa |
| 2013/0287226 | A1 | 10/2013 | Kerner |
| 2013/0332154 | A1 | 12/2013 | Oshikiri |
| 2014/0372107 | A1 | 12/2014 | Vilermo |
| 2015/0049880 | A1 * | 2/2015 | Villemoes .......... H03H 17/0266 381/98 |
| 2016/0198281 | A1 | 7/2016 | Oh |
| 2017/0310505 | A1 * | 10/2017 | Nadal .................. H04L 25/022 |
| 2018/0053516 | A1 | 2/2018 | Kjoerling |

FOREIGN PATENT DOCUMENTS

| | | |
|---|---|---|
| CN | 101169934 B | 5/2011 |
| CN | 101884065 B | 7/2013 |
| CN | 102349235 B | 3/2015 |
| CN | 103155591 B | 9/2015 |
| CN | 105393553 B | 7/2019 |
| CN | 109525218 B | 12/2023 |
| EP | 2304975 B1 | 8/2014 |
| EP | 3236626 | 4/2016 |
| EP | 3991294 | 5/2022 |
| GB | 2547877 B | 8/2019 |
| JP | 2001007769 A | 1/2001 |
| JP | 2011517908 T | 6/2011 |
| JP | 2014049972 A | 3/2014 |
| KR | 1020090028755 | 3/2009 |
| KR | 101806395 B1 | 12/2017 |
| RU | 2411645 C2 | 2/2011 |
| RU | 2484579 | 6/2013 |
| TW | 201234753 A | 8/2012 |
| TW | 201419265 A | 5/2014 |
| WO | 2003046891 A1 | 6/2003 |
| WO | 2010086218 A1 | 8/2010 |
| WO | 2015187711 A1 | 12/2015 |

OTHER PUBLICATIONS

Mattera D et al: "Noncausal filters: Possible implementations and their complexity", Proceedings of International Conference on Acoustics, Speech and Signal Processing (ICASSP'03) Apr. 6-10, 2003 Hong Kong, China; [IEEE International Conference on Acoustics, Speech, and Signal Processing (ICASSP)], IEEE, 2003 IEEE International Con Fe, vol. 6, Apr. 6, 2003 (Apr. 6, 2003), pp. VI 365-VI 368.

McGrath D S: An Efficient 30-Band Graphic Equaliser Implementation for a Low Cost DSP Processor11 • Preprints of Papers Presented at the AES Convention, xx. xx. vol. 95, Oct. 7, 1993 (Oct. 7, 1993), pp. 1-08.

Yoo, H. et al."C4 Band-Pass Delay Filter for Continuous-Time Subband Adaptive Tapped-Delay Filter" May 23, 2004, 2004 IEEE International Symposium on Circuits and Systems (IEEE Cat. No.04CH37512), Vancouver, BC, 2004, pp. V-V.

Huang, J. et al "Subband-Based Adaptive Decorrelation Filtering for Co-Channel Speech Separation" IEEE Transactions on Speech and Audio Processing, vol. 8, No. 4, Jul. 2000, pp. 402-406-.

Pandey, Ashutosh "Perceptually Motivated Signal Processing for Digital Hearing Aids" May 2011, Subject Biomedical.

* cited by examiner

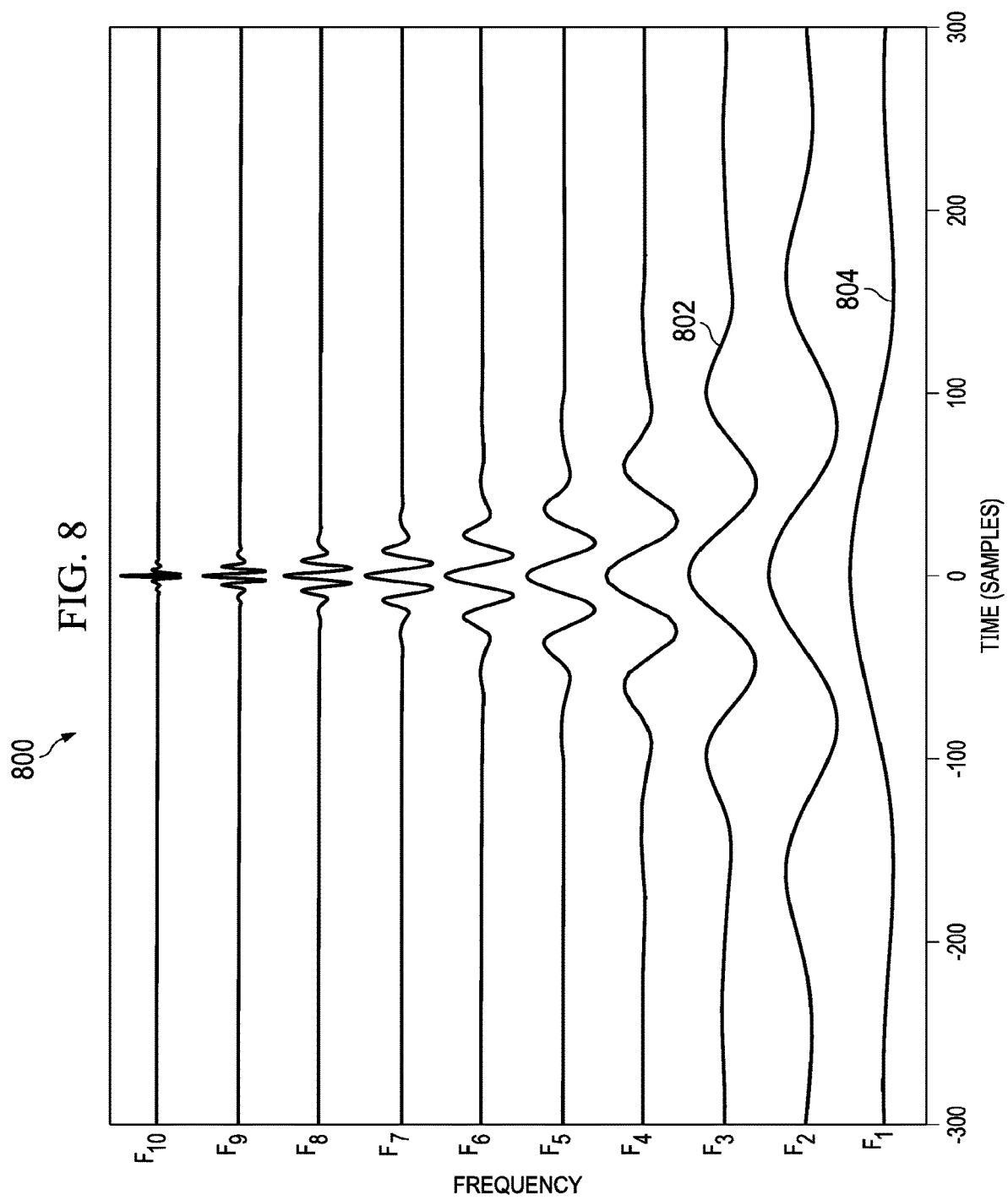

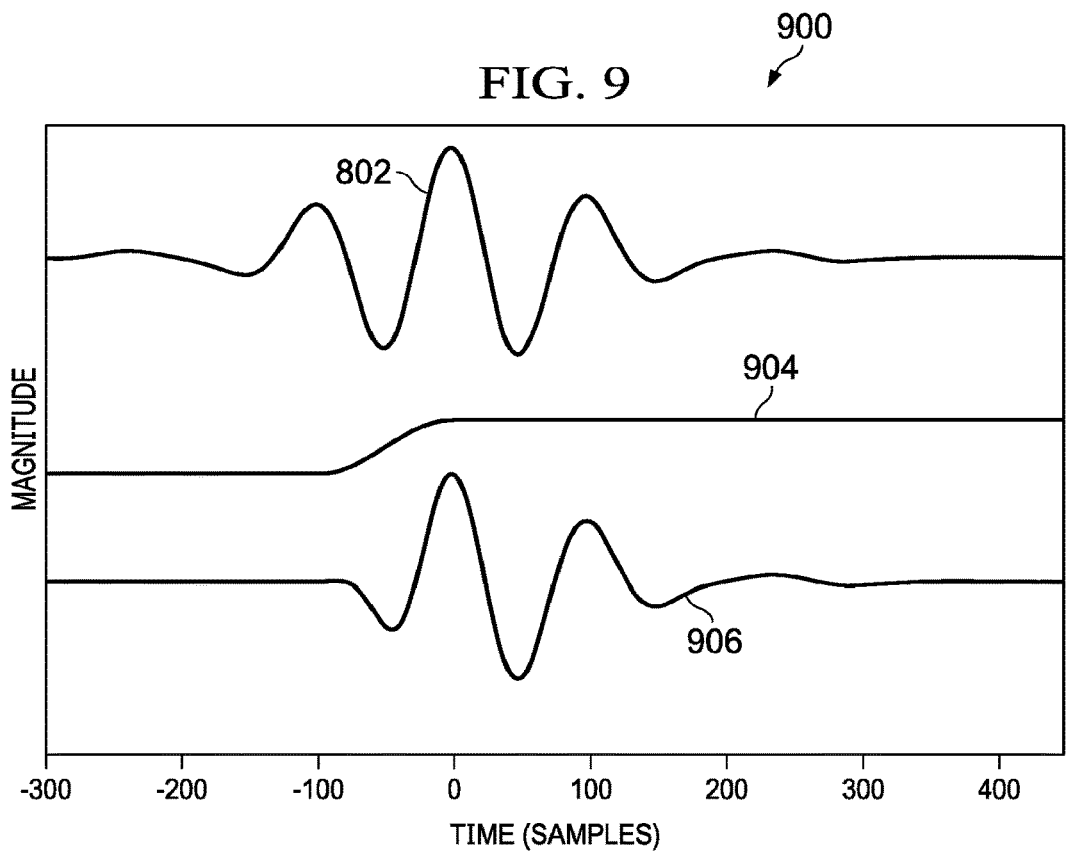
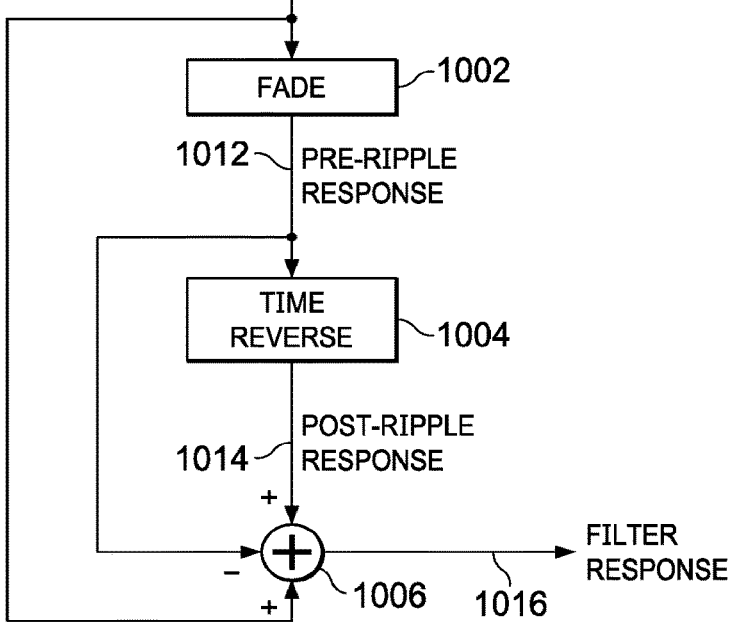

LOW LATENCY AUDIO FILTERBANK HAVING IMPROVED FREQUENCY RESOLUTION

CROSS REFERENCE TO RELATED APPLICATIONS

This application is a U.S. National Stage of International Application No. PCT/US2020/039472, filed Jun. 25, 2020, which claims priority to U.S. Provisional Patent Application No. 63/028,966, filed May 22, 2020 and U.S. Provisional Patent Application No. 62/866,823, filed Jun. 26, 2019, each of which is hereby incorporated by reference in its entirety.

FIELD

The present disclosure relates to audio processing, and in particular, to dynamic audio filters.

BACKGROUND

Unless otherwise indicated herein, the approaches described in this section are not prior art to the claims in this application and are not admitted to be prior art by inclusion in this section.

When an input audio signal is being processed, it is often desirable to use a filter bank to alter the audio signal such that the gain at various frequencies is specified by a set of dynamic coefficients. A dynamic audio filter may be implemented by making use a number of pre-computed band-pass filters, with the audio filter response being formed from the weighted sum of the band-pass filter responses. The weights may be varied dynamically.

In general, the frequency bands do not have the same bandwidth, but instead the lower frequency filters are narrower (and more closely spaced) than the higher frequency filters. As a consequence, the impulse responses of the higher frequency filters will be more compact (having most of their energy spread over a smaller number of samples) than the impulse responses of the lower frequency filters (having their energy spread over a larger number of samples).

SUMMARY

One issue with existing filter banks is the latency. For the lower frequency filters, in order to accurately represent the impulse response, a defined number of samples must be used, which corresponds to the latency of the filter. The higher frequency filters need not use as many samples as the lower frequency filters, and hence have a lower latency. However, in a filter bank that contains both low and high frequency filters, in order to recombine the filtered bands, the high frequency filters need to be delayed to match the latency of the low frequency filters. Thus the latency of the low frequency filters constrains the overall latency of the filter bank.

Given the above, there is a need to reduce the latency at low frequencies while preserving the impulse response of the filter. Described herein are techniques related to low-latency filter design.

According to an embodiment, a method of audio processing includes generating a plurality of modified impulse responses from a plurality of ideal impulse responses, wherein the plurality of ideal impulse responses respectively correspond to a plurality of frequencies, wherein generating the plurality of modified impulse responses includes performing a fade operation and a time reverse operation on at least one of the plurality of ideal impulse responses. The method further includes filtering an input signal with the plurality of modified impulse responses to generate an output signal.

Generating the plurality of modified impulse responses may include generating a pre-ripple response based on a first ideal impulse response; generating a post-ripple response based on the pre-ripple response; and adding the first ideal impulse response, subtracting the pre-ripple response, and adding the post-ripple response to generate a first modified impulse response.

Generating the plurality of modified impulse responses may include generating a first filter response based on a first ideal impulse response; generating a pre-ripple response based on the first filter response; generating an intermediate response based on the pre-ripple response; generating a second filter response based on the intermediate response; generating a post-ripple response based on the second filter response; and adding the first filter response, adding the post-ripple response, and subtracting the pre-ripple response to generate a first modified impulse response.

According to another embodiment, an apparatus includes a processor and a memory. The processor is configured to control the apparatus to generate a plurality of modified impulse responses from a plurality of ideal impulse responses, wherein the plurality of ideal impulse responses respectively correspond to a plurality of frequencies, wherein generating the plurality of modified impulse responses includes performing a fade operation and a time reverse operation on at least one of the plurality of ideal impulse responses. The processor is further configured to control the apparatus to filter an input signal with the plurality of modified impulse responses to generate an output signal. The apparatus may additionally include similar details to those of one or more of the methods described herein.

According to another embodiment, a non-transitory computer readable medium stores a computer program that, when executed by a processor, controls an apparatus to execute processing including one or more of the methods described herein.

The following detailed description and accompanying drawings provide a further understanding of the nature and advantages of various implementations.

BRIEF DESCRIPTION OF THE DRAWINGS

FIG. 8 is a graph 800 showing an example set of time-domain filter bank impulse responses.

FIG. 9 is a graph 900 of signals showing an improved method of modifying impulse responses.

FIG. 10 is a block diagram of a method 1000 of generating a filter response.

DETAILED DESCRIPTION

Described herein are techniques related to audio filters. In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein.

In the following description, various methods, processes and procedures are detailed. Although particular steps may be described in a certain order, such order is mainly for convenience and clarity. A particular step may be repeated more than once, may occur before or after other steps (even if those steps are otherwise described in another order), and may occur in parallel with other steps. A second step is required to follow a first step only when the first step must be completed before the second step is begun. Such a situation will be specifically pointed out when not clear from the context.

In this document, the terms "and", "or" and "and/or" are used. Such terms are to be read as having an inclusive meaning. For example, "A and B" may mean at least the following: "both A and B", "at least both A and B". As another example, "A or B" may mean at least the following: "at least A", "at least B", "both A and B", "at least both A and B". As another example, "A and/or B" may mean at least the following: "A and B", "A or B". When an exclusive-or is intended, such will be specifically noted (e.g., "either A or B", "at most one of A and B").

This document describes various processing functions that are associated with structures such as blocks, elements, components, circuits, etc. In general, these structures may be implemented by a processor that is controlled by one or more computer programs.

Figure 1:
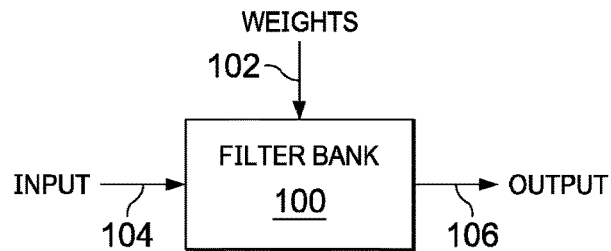
FIG. 1 is a block diagram of a filter bank 100.

FIG. 1 is a block diagram of a filter bank 100. The filter bank 100 includes a number of filters that are not individually shown. The filter bank 100 is configured with a number of weights 102 (also referred to as weighting coefficients), where each of the weights 102 corresponds to a gain for a particular frequency band. The filter bank 100 receives an input signal 104, applies the weights 102 to the input signal 104, and generates an output signal 106. The weights 102 may vary over time.

The input signal 104 (and the output signal 106) may be a single channel signal, in which case the filter bank 100 includes a number of filters, where each filter corresponds to one of the weights 102 and a particular frequency band. The input signal 104 (and the output signal 106) may be a multichannel signal, in which case the filter bank 100 includes a number of arrays of filters, where each array of filters corresponds to one of the channels, and each filter in a given array corresponds to one of the weights 102 and a particular frequency band. The input signal 104 and the output signal 106 may be multichannel signals with differing number of channels, where each array of filters corresponds to one of the input channels and one of the output channels.

In general, the filtering techniques described herein may be applied to each individual filter in the filter array 100.

Figure 2:
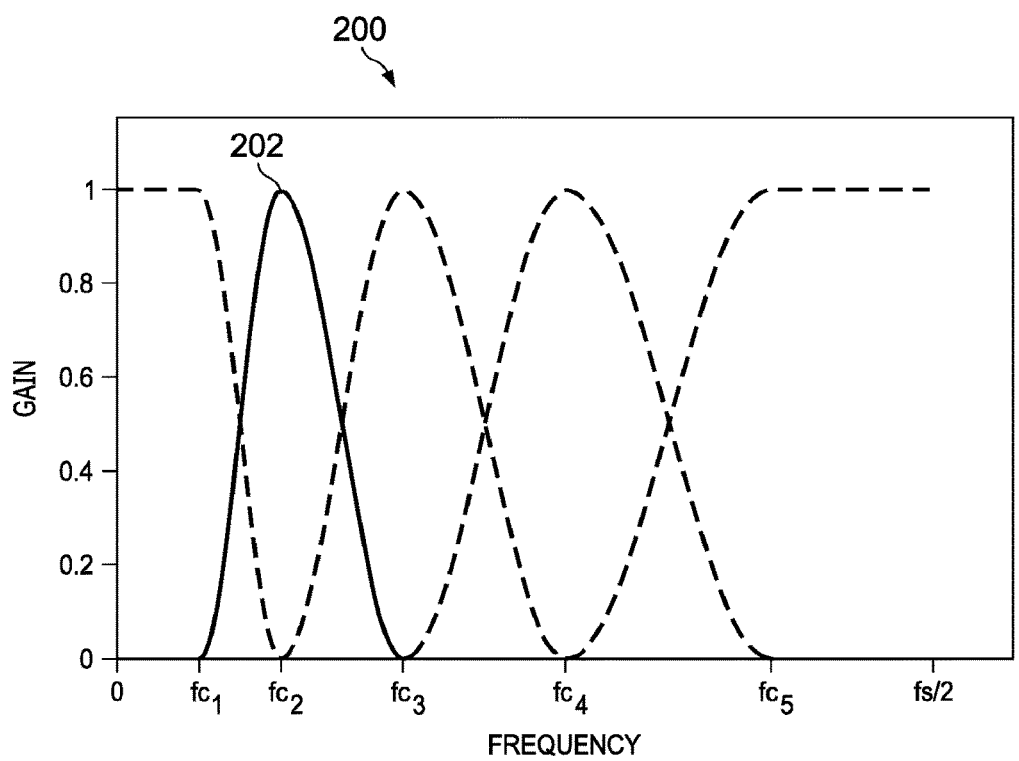
FIG. 2 is a graph 200 showing a set of filter bank frequency responses.

FIG. 2 is a graph 200 showing a set of filter bank frequency responses. In the graph 200, the x-axis is the frequency and the y-axis is the gain. By way of example, a set of B band-pass impulse responses, $h_1(n)$, $h_2(n)$, ..., $h_B(n)$ may be pre-computed, with band-pass center frequencies $fc_1$, $fc_2$, ..., $fc_B$. Ideally, the filter $h_b(n)$ will have a frequency response, $H_b(f)$ that (approximately) satisfies:

$$|H_b(fc_k)| = \begin{cases} 1 & \text{when } k = b \\ 0 & \text{otherwise} \end{cases} \quad \text{Equation (1)}$$

The frequency response 202 of filter $H_2(f)$ is shown having a gain of 1 at $f=fc_2$ and a gain of 0 at all other values of $f=fc_b$, $b \neq 2$. The other filters $H_b(f)$ have a gain of 1 at other of the frequencies $fc_b$. The frequency fs/2 is the frequency of half of the sampling rate (the Nyquist rate).

A set of weighting coefficients, $w_1$, $w_2$, ..., $w_B$ may then be used to form the combined filter response. The time-domain and frequency-domain versions of the equation are as follows:

$$\text{Time domain: } h(n) = \sum_{b=1}^{B} h_b(n) w_b \quad \text{Equation (2)}$$

$$\text{Frequency domain: } H(f) = \sum_{b=1}^{B} H_b(f) w_b \quad \text{Equation (3)}$$

Figure 3:
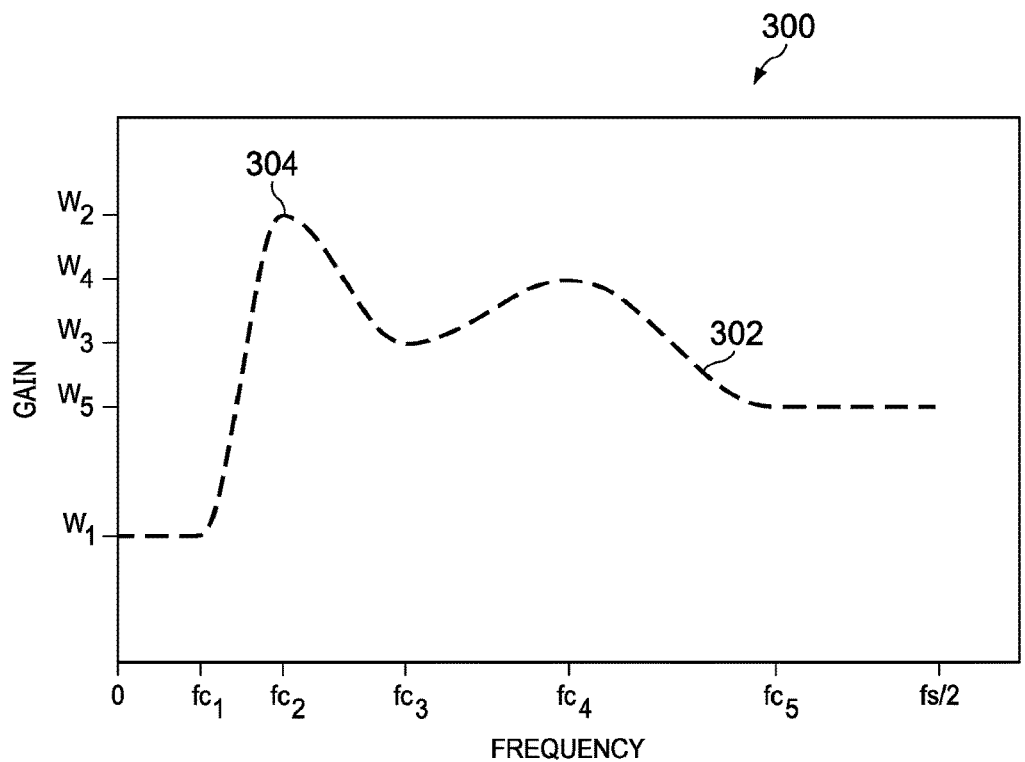
FIG. 3 is a graph 300 showing an example combined filter response 302.

FIG. 3 is a graph 300 showing an example combined filter response 302. The x-axis is the frequency (five frequency values shown) and the y-axis is the gain (five corresponding weights shown). The gain 304 at $f=fc_2$ is equal to $w_2$, as an example. The other frequencies $fc_b$ have gains that correspond to their respective weights $w_b$. In a practical application, this combined filter response may be implemented in a variety of ways, as shown in FIGS. 4-5.

Figure 4:
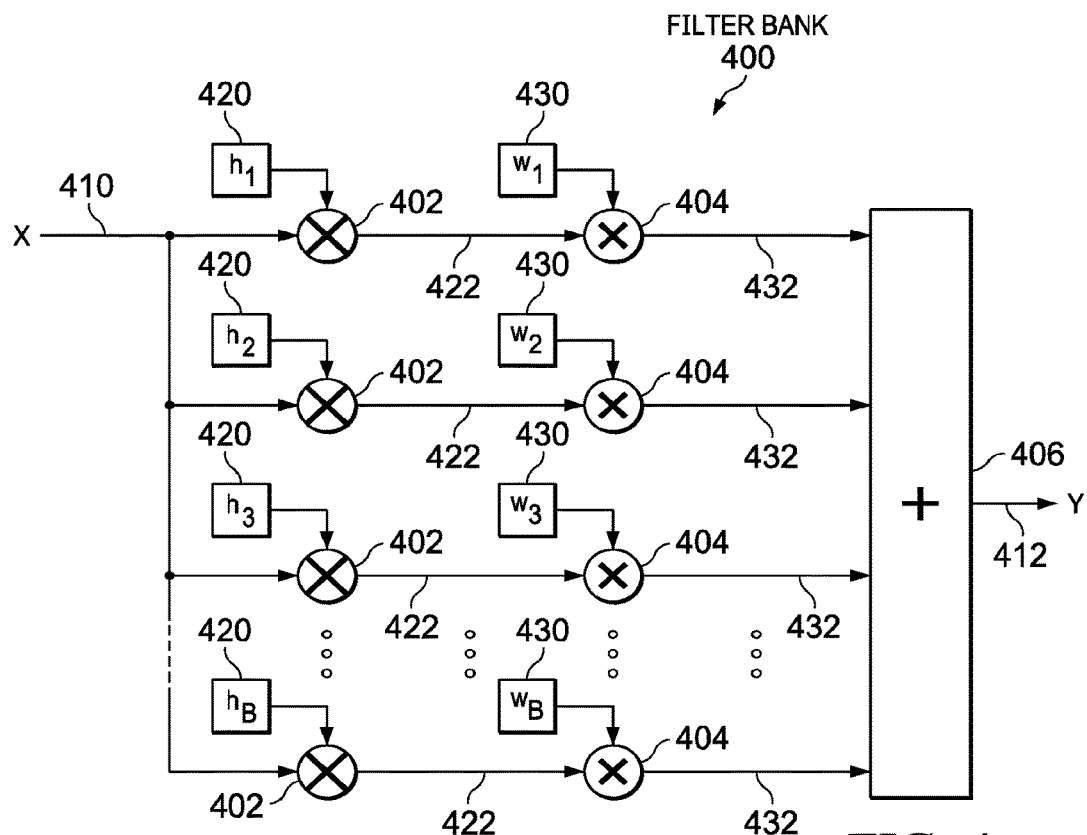
FIG. 4 is a block diagram of a filter bank 400.
Figure 5:
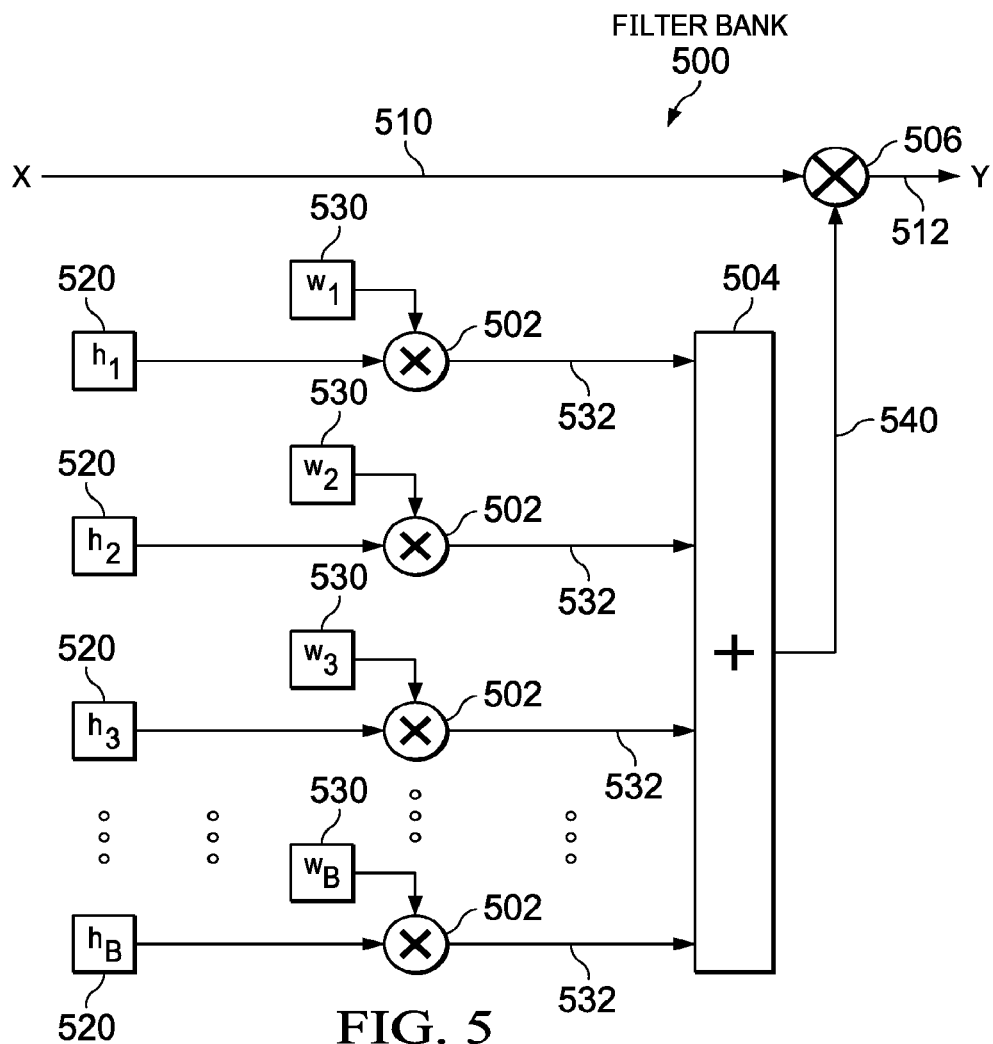
FIG. 5 is a block diagram of a filter bank 500.

FIG. 4 is a block diagram of a filter bank 400. The filter bank 400 includes a number of convolution blocks 402, a number of multiplication blocks 404, and an addition block 406. The filter bank 400 receives an input signal 410 (shown as X and also referred to as x(n), which references the input signal for a given sample n), and generates an output signal 412 (shown as Y and also referred to as y(n)).

Each of the convolution blocks 402 generally corresponds to a given frequency, frequency band or frequency range associated with an impulse response 420 (shown as $h_b$). A given convolution block 402 convolves the input signal 410 (e.g., x(n)) with the inpulse response 420 (e.g., $h_b(n)$) to generate a filtered signal 422 (e.g., $x_b(n)$).

Each of the multiplication blocks 404 is associated with a weight 430 (shown as $w_b$) and is associated with one of the convolution blocks 402 (so likewise associated with a frequency band). A given multiplication block 404 multiplies the filtered signal 422 (e.g., $x_b(n)$) with the weight 430 (e.g., $w_b$) to generate a weighted signal 432.

The addition block 406 adds the weighted signal 432 from each of the multiplication blocks 404 to generate the output signal 412.

The equations representing these operations are as follows:

$$\text{Filtered sub-band signals: } x_b(n) = \{h \otimes x\}(n) \quad \text{Equation (4)}$$

$$= \sum_{k=-\infty}^{\infty} h(k)x(n-k) \quad \text{Equation (5)}$$

$$\text{Filtered output: } y(n) = \sum_{b=1}^{B} x_b(n)w_b \quad \text{Equation (6)}$$

The $\{\ldots \otimes \ldots\}$ operator used in Equation (4) indicates the convolution of h(n) with x(n).

Equation (5) shows the details of the convolution operation, resulting in the creation of sub-band signals $x_1(n)$, $x_2(n)$, ..., $x_B(n)$. The output signal 412 (e.g., y(n)) is then formed as the sum of these sub-band signals multiplied by their respective weights, as shown in Equation (6).

According to this method, the weights may be time-varied, so $w_b$ may also be replaced by $w_b(n)$ in Equation (6).

FIG. 5 is a block diagram of a filter bank 500. The filter bank 500 includes a number of multiplication blocks 502, an addition block 504, and a convolution block 506. The filter bank 500 receives an input signal 510 (shown as X and also referred to as x(n), which references the input signal for a given sample n), and generates an output signal 512 (shown as Y and also referred to as y(n)).

Each of the multiplication blocks 502 generally corresponds to a given frequency, frequency band or frequency range associated with an impulse response 520 (shown as $h_b$), and is also associated with a weight 530 (shown as $w_b$). A given multiplication block 502 multiplies the impulse response 520 (e.g., $h_b(n)$) and the weighting coefficient 530 (e.g., $w_b(n)$) to generate one of the weighted responses 532.

The addition block 504 adds the weighted responses 532 from each of the multiplication blocks 502 to generate a combined filter response 540.

The convolution block 506 convolves the input signal 510 (e.g., x(n)) with the combined filter response 540 to generate the output signal 512 (e.g., y(n)).

In general, the filter bank 500 implements a dynamic filter that performs a periodic calculation of the filter response. For example, the input audio may be processed in (overlapped) blocks of audio, and at the time of block #k, the filter response (in the frequency domain) may be computed as per Equation (3).

In one embodiment, we may implement the actual convolution operation in the frequency domain, using overlapped audio blocks, with smoothed cross-fades between audio block, which may allow the filter response to be changed on a block-by-block basis.

In one common application, the filter bank responses are causal filters, in which the filter output depends only on past and present inputs (so that for each $b \in \{1, 2, \ldots, B\}$ the impulse response $h_b(n)=0$, $\forall n<0$. If all filter bank responses are causal, then the combined response (h(n), as per Equation (2)) will also be causal.

Figure 6:
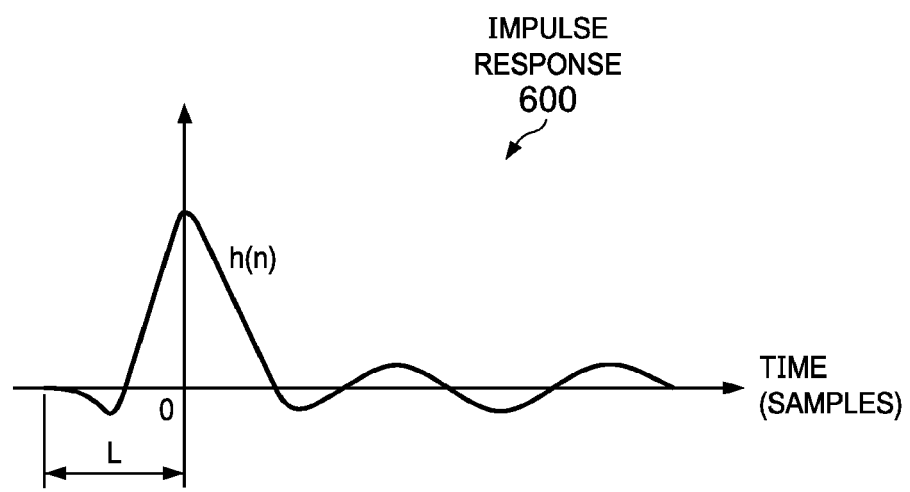
FIG. 6 is a graph of an impulse response 600.

FIG. 6 is a graph of an impulse response 600. The impulse response 600 results from applying a filter such that for each $b \in \{1, 2, \ldots, B\}$ the impulse response $h_b(n)=0$, $\forall n<-L$ where L is a positive integer. Filters with this property may be implemented in practice by adding an additional delay of L samples in the filter implementation (so that the impulse responses are shifted by L samples in time to allow them to be implemented as causal filters).

Figure 7:
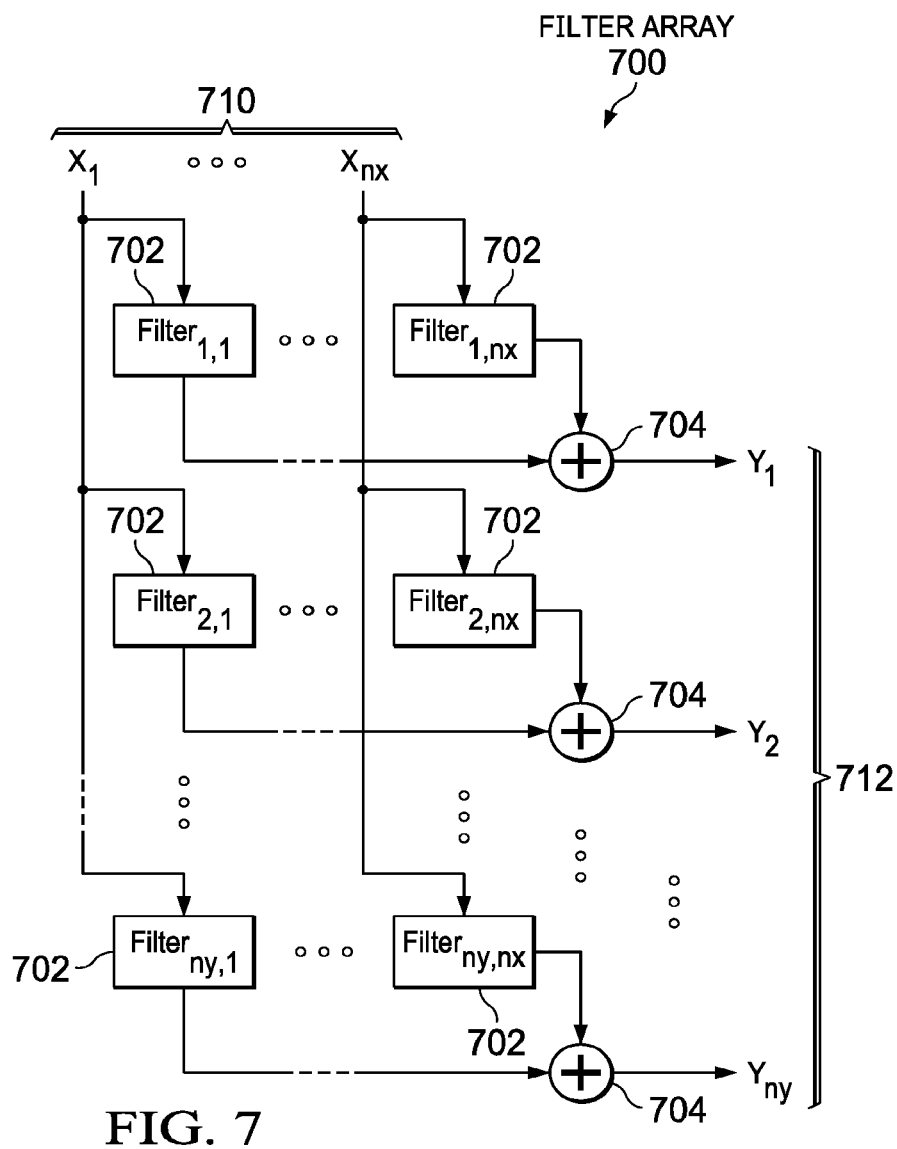
FIG. 7 is a block diagram of a filter array 700.

FIG. 7 is a block diagram of a filter array 700. The filter array 700 includes a number of filters 702 (shown as Filter$_{ny,nx}$) and a number of addition blocks 704. The filter array 700 receives a number of input signals 710 (shown as $X_1$ to $X_{nx}$) and generates a number of output signals 712 (shown as $Y_1$ to $Y_{ny}$). In general, the filter array 700 illustrates the operation of a multichannel-input, multichannel-output system, where a filter joins every input to every output. The filter 700 may also be conceptualized as a multichannel filter bank where, for each frequency band, there is a [ny by nx] two-dimensional array that defines the mixing of inputs to form the outputs.

The filters 702 are arranged in banks, where each filter bank is associated with one of the input signals 710 (e.g., a channel). Each of the filters 702 is generally associated with a frequency band, a filter response, and a weight similar to the other filters discussed herein. For example, each of the filters 702 may be a filter such as the filter bank 400 (see FIG. 4), the filter bank 500 (see FIG. 5), etc.

In terms of frequency domain filter responses, we may describe the processing of the filter array 700 in terms of the following equation:

$$Y_j(f) = \sum_{i=1}^{nx} \text{Filter}_{j,i}(f) \times X_i(f) \quad \text{Equation (7)}$$

The embodiments described herein relate to methods used to implement one or more of the filters 702. It will be appreciated that embodiments are equally applicable to arrays of filters as shown in FIG. 7.

Referring back to FIG. 3, the desired frequency response of an example filter is shown, where the gain of the filter response 302, as a function of frequency, is defined according to a pre-defined set of control frequencies, $fc_1$, $fc_2$, ... and corresponding gain values, $w_1$, $w_2$, ....

In the example of FIG. 3, the gain of the filter at frequency $fc_2$ is set by $w_2$, as shown as the gain 204.

In an embodiment, the frequency response of FIG. 3 is achieved by the weighted summation of a number of pre-defined filter bank responses. Example responses are shown in FIG. 2, with the frequency response 202 of band 2 being shown.

We will refer to the response of each of these pre-defined filter bank responses as $H_b(f)$ (in the frequency domain) or alternately as $h_b(n)$ (in the time domain).

A desired filter response (such as 302 in FIG. 3) may be formed from a weighted sum of pre-defined filter bank responses. This may be expressed as a time-domain or frequency-domain summation:

$$\text{Time domain: } h(n) = \sum_{b=1}^{B} h_b(n)w_b \quad \text{Equation (8)}$$

$$\text{Frequency domain: } H(f) = \sum_{b=1}^{B} H_b(f)w_b \quad \text{Equation (9)}$$

We may choose to insist that each of the pre-defined filter bank responses should represent a causal filter (so that h(n)=0, $\forall n<0$). However, as a matter of convenience, we instead insist that h(n)=0, $\forall n<-L$ and we therefore will be required to add L samples of latency to the implementation of our filters, so that the final (realizable) filter output, y'(n), will be computed as a delayed version of the ideal response, y(n), according to:

$$y(n) = \sum_{k=-L}^{\infty} h(k)x(n-k) \quad \text{Equation (10)}$$

$$y'(n) = y(n-L) \quad \text{Equation (11)}$$

$$= \sum_{k=-L}^{\infty} h(k)x(n-L-k) \quad \text{Equation (12)}$$

Note that the calculation of output sample n of the ideal signal, y(n), is computed using input samples up to x(n+L) (including L future input samples). In contrast, the calculation of output sample n of the delayed signal, y'(n), is computed only using input samples up to x(n).

An example impulse response, with the property that h(n)=0, ∀n<−L, is shown in FIG. 6.

In an embodiment, the frequency resolution of the filter bank (the spacing between adjacent filter bank center frequencies, for example $fc_{b+1}-fc_b$) is small, whilst the latency L is also small.

In one particular embodiment, a low-latency filter bank is used to provide low latency L and high resolution. In a further embodiment, an all-pass low-latency filter bank is used to provide low perceived latency L and high resolution.

Ideal Filter Bank Responses

A filter bank may be constructed by a variety of means, including a method whereby ideal frequency responses are created as shown in FIG. 2, and then converted to linear-phase ideal time-domain impulse responses.

FIG. 8 is a graph 800 showing an example set of time-domain filter bank impulse responses. In the graph 800, the x-axis is time (in samples) and the y-axis is frequency. Numerous filter responses are shown in the graph 800, with each filter response corresponding to a given frequency as indicated by the names $F_1, F_2, \ldots, F_B$, where the number of filters in the filter bank, in this example is B=10. The highest number (e.g. 10) corresponds to the highest frequency and the lowest number (e.g. 1) corresponds to the lowest frequency. The ideal impulse response for filter $F_b$ is $h'_b(n)$ (for b∈{1, 2, ..., B}). Two filter responses 802 and 804 are indicated for further discussion below; the filter response 802 corresponds to the 3rd filter ($h'_3(n)$) and the filter response 804 corresponds to the lowest frequency filter response ($h'_1(n)$).

According to a common practice, the ideal filter bank responses exhibit a perfect summation property, as follows:

$$\sum_{b=1}^{B} h'_b(n) = \delta(n) \quad \text{Equation (13)}$$

$$\text{where } \delta(n) = \begin{cases} 1 & n=0 \\ 0 & \text{otherwise} \end{cases} \quad \text{Equation (14)}$$

Preferably, we may make use of filter banks where the lower frequency filters are narrower (and more closely spaced) than the higher frequency filters, as is illustrated in FIG. 2, where the separation between $fc_1$ and $fc_2$ is less than the separation between $fc_4$ and $fc_5$, for example. As a consequence, the impulse responses of the higher frequency filters will be more compact (having most of their energy spread over a smaller number of samples) than the impulse responses of the lower frequency filters, as may be observed in FIG. 8.

Theoretically, the impulse responses of the ideal filter banks may be infinite in length, and in particular it may be seen, in FIG. 8, that the impulse response 802 of the filter $F_3$ does not satisfy the desired low-latency property: $h'_3(n)=0$, ∀n<−L. Hence, the filters shown in FIG. 8 are not suitable for implementing a low-latency filter bank.

Techniques for Low-Latency Filter Responses

According to one method, a low-latency filter bank (with latency L) may be created by simply truncating the ideal impulse responses, as follows:

$$h_b(n) = \begin{cases} h'_b(n) & n \geq -L \\ 0 & n < -L \end{cases} \quad \text{Equation (15)}$$

However, such truncation will impact the resulting responses at low frequencies, and may result in auditory artifacts if used in a real world system.

FIG. 9 is a graph 900 of signals showing an improved method of modifying impulse responses. In the graph 900, the x-axis is time (in samples). The y-axis is magnitude; note that each signal is independent of each other on the y-axis (e.g., the y-axis shows the magnitude range of each signal independently, not any sort of relative magnitude or comparison between signals). The signal 802 corresponds to the ideal impulse response of the filter $F_3$ (e.g., $h'_3(n)$), as also shown in FIG. 8. The signal 904 corresponds to a fade function. The signal 906 corresponds to the signal 802 multiplied by the signal 904 to generate a low-latency filter response, as follows:

$$h_b(n) = h'_b(n)q(n) \quad \text{Equation (16)}$$

$$\text{where: } q(n) = \begin{cases} 0 & n < -L \\ 1 & n \geq 0 \\ \cos^2\left(\dfrac{n\pi}{2(L+1)}\right) & -L \leq n < 0 \end{cases} \quad \text{Equation (17)}$$

It will be appreciated by those skilled in the art that according to both techniques (Equation (15) and Equation (16)), the resulting impulse response $h_b(n)$ has the desirable property that $h_b(0)=h'_b(0)$, and this guarantees that the perfect-reconstruction criteria (Equation (13)) will be satisfied.

However, the frequency response of these filters (as produced by Equation (15) or Equation (16)) will not necessarily match the original (ideal) responses, $h'_b(n)$ as well as may be possible with improved techniques, as discussed below.

Improved Method for Low-Latency Filter Responses

FIG. 10 is a block diagram of a method 1000 of generating a filter response. The method 1000 may be used to generate the filter response for one or more of the filters in any of the filter banks discussed herein (e.g., the filter bank 400 of FIG. 4, the filter bank 500 of FIG. 5, the filter 702 in the filter array 700 of FIG. 7, etc.). The method 1000 includes a fade block 1002, a time reverse block 1004, and a summation block 1006. The blocks of the method 1000 may be implemented in various ways, e.g. by circuit elements, by a processor executing one or more computer programs, etc.

The fade block 1002 receives an ideal impulse response 1010, applies a fade function, and generates a pre-ripple response 1012. The ideal impulse response 1010 may correspond to one or more of the ideal impulses responses discussed above (e.g., h'$_b$(n) as discussed in FIG. 8 or FIG. 9, such as the signal 802). An example of the fade function is shown in FIG. 11.

The time reverse block 1004 performs a time reverse operation on the pre-ripple response 1012 to generate a post-ripple response 1014. The time reverse operation generally corresponds to mirroring the pre-ripple response 1012 around the zero sample of the signal. An example of the time reverse operation is shown in FIG. 11.

The summation block 1006 adds the ideal impulse response 1010, subtracts the pre-ripple response 1012, and adds the post-ripple response 1014, to generate a filter response 1016.

Figure 11:
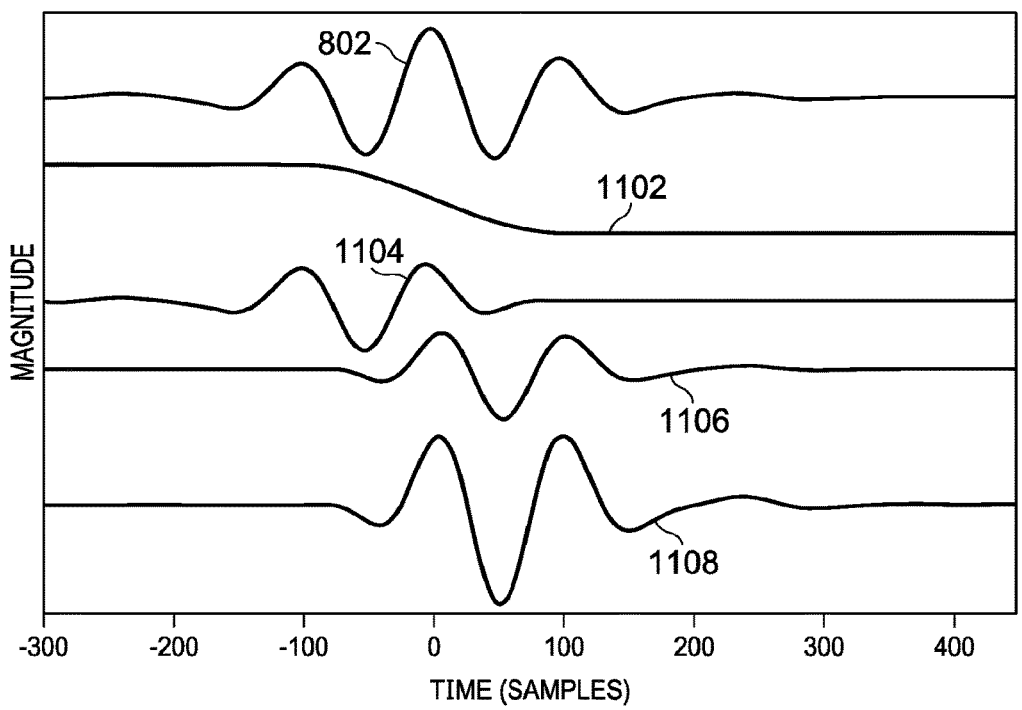
FIG. 11 is a graph 1100 showing various signals related to FIG. 10.

FIG. 11 is a graph 1100 showing various signals related to FIG. 10. In the graph 1100, the x-axis is time (in samples) and the y-axis is magnitude; as with FIG. 9, note that the magnitude of each signal is independent of each other signal. The signal 802 corresponds to the ideal impulse response of the filter F$_3$ (e.g., h'$_3$(n)), as also shown in FIGS. 8-9. See also the ideal impulse response 1010 in FIG. 10.

The signal 1102 corresponds to a fade function. See also the signal 904 in FIG. 9. The signal 1104 corresponds to the signal 802 multiplied by the signal 1102 to generate a pre-ripple response. See also the pre-ripple response 1012 in FIG. 10.

The signal 1106 corresponds to a time reverse of the signal 1104, referred to as the post-ripple response. See also the post-ripple response 1014 in FIG. 10.

The signal 1108 corresponds to the filter bank response, and is generated by adding the signal 802 (the ideal impulse response 1010), subtracting the signal 1104 (the pre-ripple response 1012), and adding the signal 1106 (the post-ripple response 1014). See also the filter response 1016 in FIG. 10.

The following equations show this process:

$$\text{pre-ripple: } r_b^{pre}(n) = h'_b(n)s(n) \quad \text{Equation (18)}$$

$$\text{fade-function: } s(n) = \begin{cases} 1 & n < -L \\ 0 & n > L \\ \cos^2\left(\frac{(n+L+1)\pi}{4(L+1)}\right) & -L \leq n \leq L \end{cases} \quad \text{Equation (19)}$$

$$\text{post-ripple: } r_b^{post}(n) = r_b^{pre}(-n) \quad \text{Equation (20)}$$

$$\text{low-latency response: } h_b(n) = h'_b(n) - r_b^{pre}(n) + r_b^{post}(n) \quad \text{Equation (21)}$$

Note that, according to Equation (20), $r_b^{post}(0) = r_b^{pre}(0)$ and hence, the low-latency impulse response h$_b$(n) (as per Equation (21) will have the desirable property that h$_b$(0)=h'$_b$(0), and this guarantees that the perfect-reconstruction criteria (Equation (13)) will be satisfied.

Low-Latency All-Pass Filter Responses

Various types of audio filtering may be used to modify an audio signal without the group delay of the filtering being perceptible to a listener. As an example, a typical high-pass filter, such as that used to remove unwanted low-frequency noise from recorded sounds, will introduce phase distortion at low frequencies that will not be considered by a listener to be detrimental. Another common type of filtering that will be imperceptible to a listener is an all-pass filter.

Figure 12:
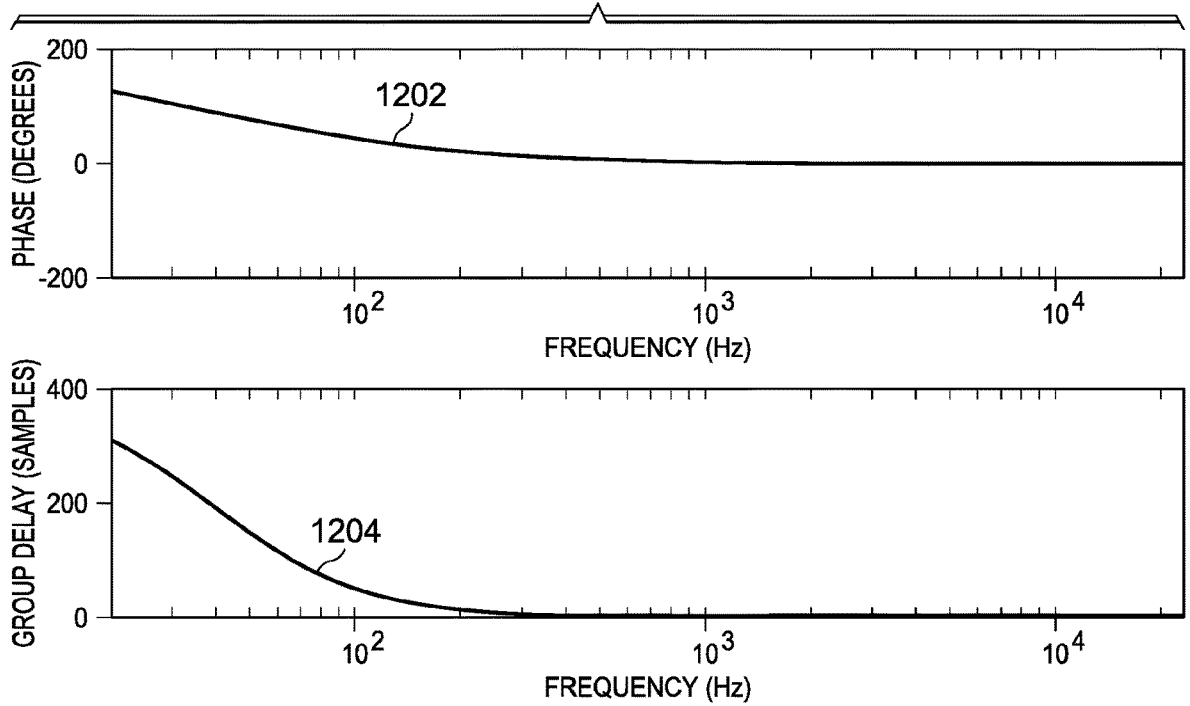
FIG. 12 is a set of graphs showing a phase distortion 1202 and a group delay 1204.

FIG. 12 is a set of graphs showing a phase distortion 1202 and a group delay 1204. The phase distortion 1202 and the group delay 1204 result from using the transfer function as shown in Equation (22) to process an audio signal sampled at 48 kHz.

$$G_{ap} = \frac{0.994986 - 1.000000z^{-1}}{1.000000 - 0.994986z^{-1}} \quad \text{Equation (22)}$$

The constant 0.994986 in Equation (22) is a typical value that corresponds to a transition frequency of approximately 37 Hz (where the phase shift of a first-order all-pass filter is 90 degrees), for a filter operating at a sample rate of 48000 samples per second. Alternative values for this constant may be chosen, and for filters operating at 48000 samples per second, the constant may vary between 0.9490 and 0.9993, which values correspond to transitions frequencies of 400 Hz and 5 Hz, respectively.

Figure 13:
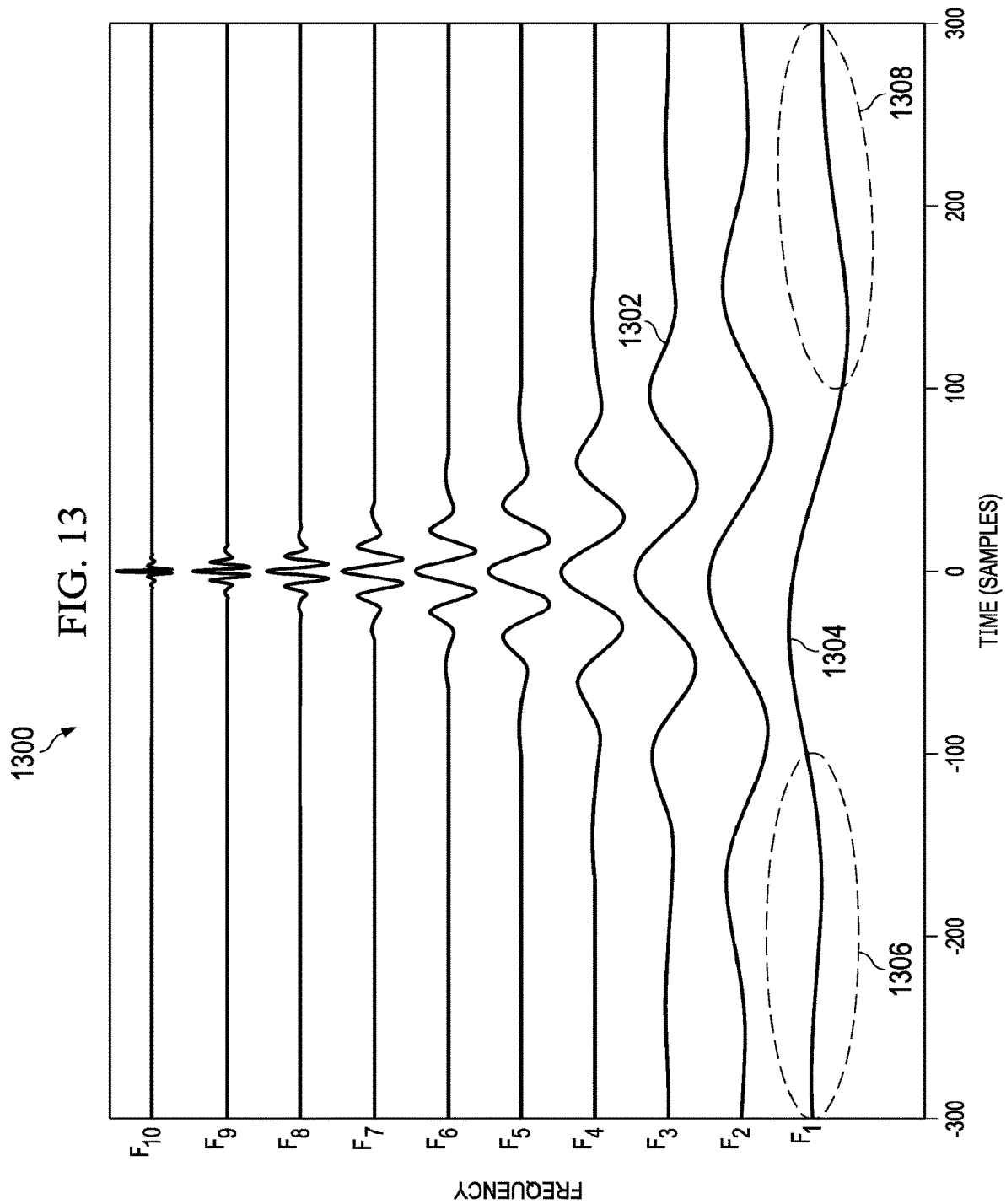
FIG. 13 is a graph 1300 showing various impulse responses.

Given that this phase distortion 1202 produces artefacts in the output audio signal that are acceptable to a listener, it is therefore acceptable to apply the same phase distortion to the ideal impulse responses, to produce a new set of all-pass filter responses, as shown in FIG. 13.

FIG. 13 is a graph 1300 showing various impulse responses. In the graph 1300, the x-axis is time (in samples) and the y-axis arranges the impulse responses at various frequencies F$_n$. The impulse response 1302 of filter F$_3$ appears to be similar to original (ideal) response 802 of filter F$_3$ in FIG. 8. In contrast, the impulse response 1304 of filter F$_1$ appears to be different from the original (ideal) response 804 of filter F$_1$ in FIG. 8. This difference is due to the effect of an all-pass filter, which affects the lower frequency filters, whilst having a negligible impact on the higher frequency filters. The all-pass filter is discussed in more detail below.

It can be seen that the impulse response 1304 of the filter F$_1$ has lower amplitude in the region 1306 (more than 100 samples prior to time zero) compared to the region 1308 (more than 100 samples after time zero). The shifting of the energy of the impulse response to a later time in the impulse response is a desirable attribute of the all-pass filter, as it produces a filter bank that more closely approximates the latency constraint (where L=100 in the example of FIG. 13).

Figure 14:
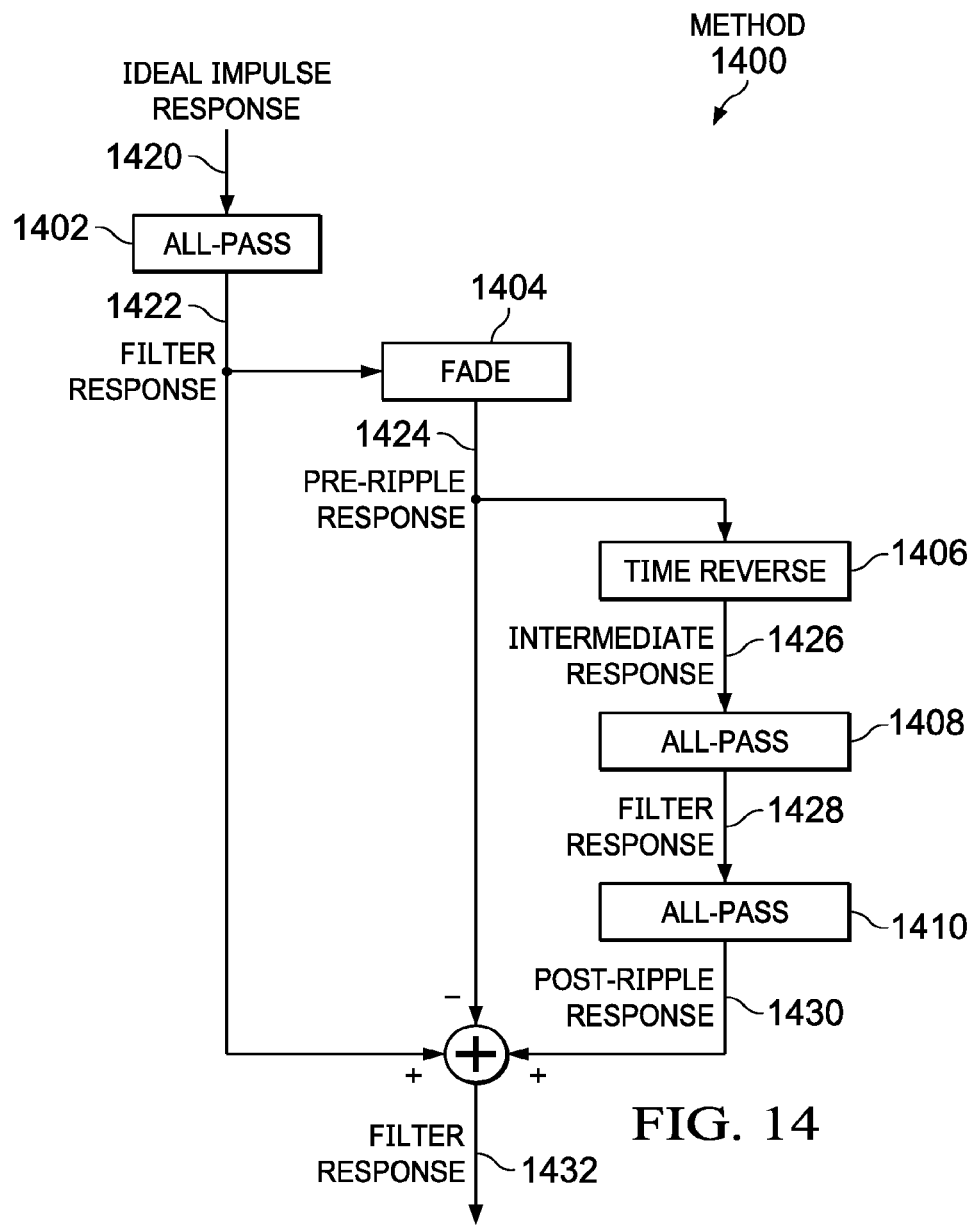
FIG. 14 is a block diagram of a method 1400 of generating a filter response.

FIG. 14 is a block diagram of a method 1400 of generating a filter response. The method 1400 may be used to generate the filter response for one or more of the filters in any of the filter banks discussed herein (e.g., the filter bank 400 of FIG. 4, the filter bank 500 of FIG. 5, the filter 702 in the filter array 700 of FIG. 7, etc.). The method 1400 includes an all-pass filter 1402, a fade block 1404, a time reverse block 1406, an all-pass filter 1408, an all-pass filter 1410, and a summation block 1412. The blocks of the method 1400 may be implemented in various ways, e.g. by circuit elements, by a processor executing one or more computer programs, etc.

The all-pass filter 1402 receives an ideal impulse response 1420, performs all-pass filtering, and generates a filter response 1422. The ideal impulse response 1420 may correspond to one or more of the ideal impulses responses discussed above (e.g., h'$_b$(n) as discussed in FIG. 8 or FIG. 9, such as the signal 802). The impulse response of the all-pass filter is discussed in more detail in the equations below.

Figure 15:
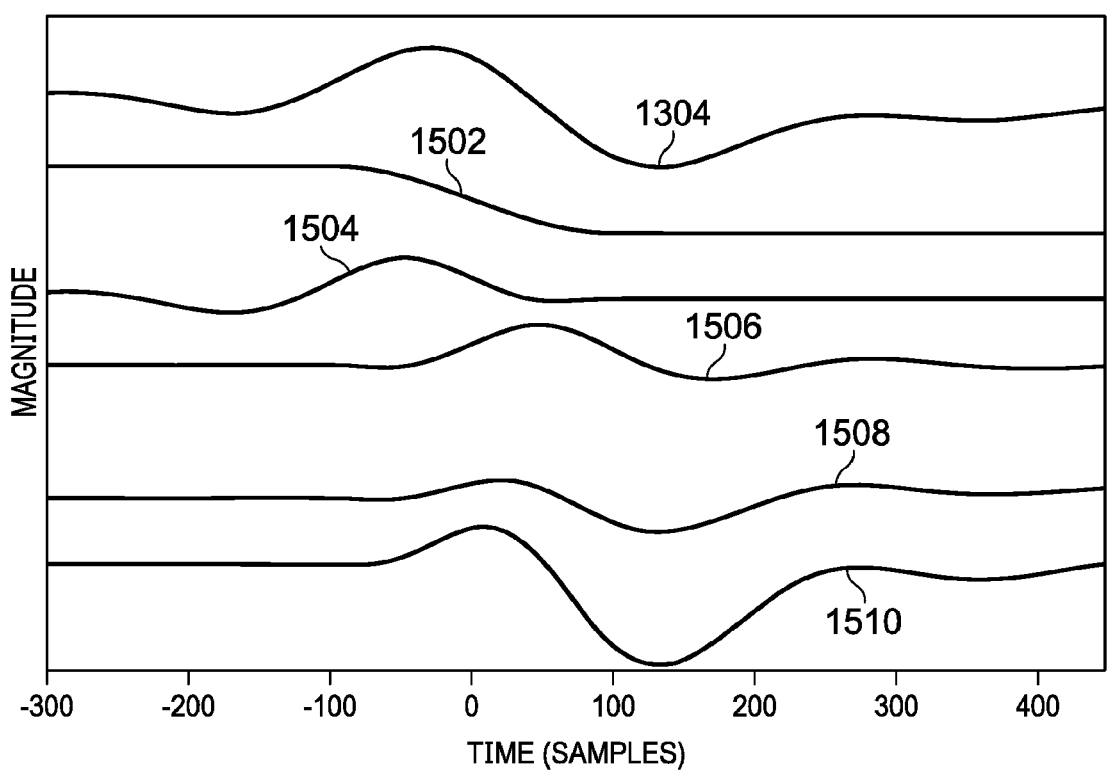
FIG. 15 is a graph 1500 showing various signals related to FIG. 14.

The fade block 1404 applies a fade function to the filter response 1422 to generate a pre-ripple response 1424. An example of the fade function is shown in FIG. 15.

The time reverse block 1406 performs a time reverse operation on the pre-ripple response 1424 to generate an intermediate response 1426. An example of the time reverse operation is shown in FIG. 15.

The all-pass filter 1408 performs all-pass filtering on the intermediate response 1426 to generate a filter response 1428.

The all-pass filter 1410 performs all-pass filtering on the filter response 1428 to generate a post-ripple response 1430.

The summation block 1412 adds the filter response 1422, adds the post-ripple response 1430, and subtracts the pre-ripple response 1424, to generate a filter response 1432.

In an embodiment, in order to correctly satisfy the latency constraint, we apply the process of Equation (21), with an adaptation to the calculation, to allow for the introduction of the all-pass filter. In the following equations, the notation $\{a \otimes b\}(n)$ is used to indicate the convolution of the impulse responses a(n) and b(n). The generation of the low-latency all-pass filter responses is carried out as follows:

$$\text{all-pass: } h''_b(n) = \{g \otimes h'_b\}(n) \quad \text{Equation (23)}$$

$$\text{pre-ripple: } r_b^{pre}(n) = h''_b(n)s(n) \quad \text{Equation (24)}$$

$$\text{fade-function: } s(n) = \begin{cases} 1 & n < -L \\ 0 & n > L \\ \cos^2\left(\frac{(n+L+1)\pi}{4(L+1)}\right) & -L \leq n < 0 \end{cases} \quad \text{Equation (25)}$$

$$\text{post-ripple: } r_b^{post}(n) = r_b^{pre}(-n) \quad \text{Equation (26)}$$

$$\text{low-latency response: } h_b(n) = \quad \text{Equation (27)}$$

$$h''_b(n) - r_b^{pre}(n) + \{g \otimes g \otimes r_b^{post}\}(n)$$

In the above equations, g(n) is the impulse response of the all-pass filter (see also Equation (22)).

In an embodiment, the all-pass filter is a first-order filter with a single real pole at a frequency between 10 Hz and 200 Hz. For a filter bank that is operating on audio sampled at a rate of $F_s$ sample per second, with a latency L, the frequency of the all-pass pole may be set to approximately:

$$\text{all-pass pole freq: } f = \frac{F_s}{12L} \text{Hz} \quad \text{Equation (28)}$$

The calculation of the pole frequency as shown in Equation (28) is an example. It will be appreciated that other pole frequencies will also provide the benefit of an improved latency/accuracy trade-off in the design of a filter bank.

When the impulse responses of the set of B filters in the low-latency all-pass filter bank are summed together, the end result (the reconstruction impulse response) is approximately equal to the all-pass response:

$$h(n) = \sum_{b=1}^{B} h_b(n) \quad \text{Equation (29)}$$

$$\approx g(n) \quad \text{Equation (30)}$$

The procedure of FIG. 14 may be applied for each filter in the filter bank, so for example, for $b \in \{1, 2, \ldots, B\}$, the ideal impulse response $h'_b(n)$ may be processed according to FIG. 14 to produce the low-latency all-pass filter $h_b(n)$.

FIG. 15 is a graph 1500 showing various signals related to FIG. 14. In the graph 1500, the x-axis is time (in samples) and the y-axis is magnitude; as with FIGS. 9 and 11, note that the magnitude of each signal is independent of each other signal. The signal 1304 corresponds to the all-pass filtered impulse response of the filter $F_1$ (e.g., $h'_1(n)$), as also shown in FIG. 13. See also the filter response 1422 in FIG. 14, and Equation (23).

The signal 1502 corresponds to a fade function. See also the signal 904 in FIG. 9 and the signal 1102 in FIG. 11, and Equation (25). The signal 1504 corresponds to the signal 1304 multiplied by the signal 1502 to generate a pre-ripple response. See also the pre-ripple response 1424 in FIG. 14, and Equation (24).

The signal 1506 corresponds to a time reverse of the signal 1504, referred to as the intermediate response. See also the intermediate response 1426 in FIG. 14. The signal 1508 corresponds to applying an all-pass filter twice to the signal 1506, referred to as the post-ripple response. See also the post-ripple response 1430 of FIG. 14, and Equation (26).

The signal 1510 corresponds to the filter bank response, and is generated by adding the signal 1304 (the filter response 1422), adding the signal 1508 (the post-ripple response 1430), and subtracting the signal 1504 (the pre-ripple response 1424). See also Equation (27).

The differences between the method 1000 of FIG. 10 and the method 1400 of FIG. 14 may be conceptualized as follows. First, note that the method 1000 operates on the filter response $h'_b(n)$, and the method 1400 operates on the all-pass filtered version $g \otimes h'_b(n)$. The process of the method 1000 relies on the fact that the pre-ripple and post-ripple components are made by mirroring around t=0, and in conjunction we know that the ideal impulse response 1010 is symmetric about time zero.

Extending this knowledge to the method 1400, imagine we can make a new filter component: preA=$g^{-1} \otimes$pre_ripple. This means we take the original pre_ripple (e.g., the intermediate response 1426 or the signal 1506) and apply the inverse of the all-pass function g.

We then make another new filter component: postA(t)=preA(−t). This is simply the mirrored version of preA.

Now, we can make another new filter component: finalA=$h'_b(n)$+postA−preA. This step is very much like the process used in FIG. 10 and, most importantly, this step obeys our mantra: the pre-ripple and post-ripple components are made by mirroring around t=0, and in conjunction we know that the original filter is symmetric about time zero.

We can then build the final filter: final_filter=g⊗finalA=g⊗($h'_b(n)$+postA−preA)=g⊗$h'_b(n)$+g⊗postA−g⊗preA=orig_filter+g⊗postA−pre_ripple.

Now, we know that: postA=mirror(preA)=mirror($g^{-1}$⊗pre_ripple)=g⊗mirror(pre_ripple)=g⊗post_ripple. (This is true because the time-mirror of an all-pass filter is the same as the inverse of the all-pass filter.)

Hence, we get: final_filter=orig_filter+g⊗postA−pre_ripple=orig_filter+g⊗g⊗post_ripple−pre_ripple.

Figure 16:
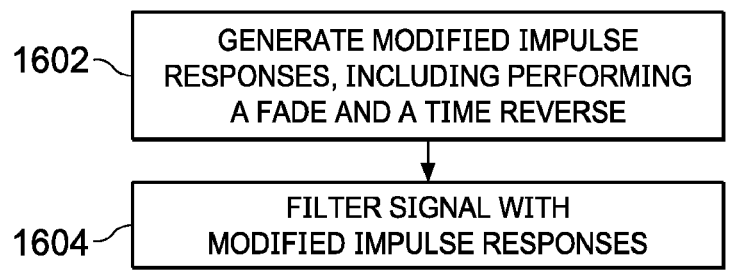
FIG. 16 is a flow diagram of a method 1600 of audio processing.

FIG. 16 is a flow diagram of a method 1600 of audio processing. The method 1600 may be implemented by a processor executing instructions e.g. according to one or more computer programs.

At 1602, modified impulse responses are generated from ideal impulse responses. The ideal impulse responses respectively correspond to a number of frequencies. Generating the modified impulse responses includes performing a fade operation and a time reverse operation on at least one of the ideal impulse responses. For example, the method 1000 (see FIG. 10) may perform a fade operation using the fade block 1002 and a time reverse operation using the time reverse block 1004 on the ideal impulse response 1010. As another example, the method 1400 (see FIG. 14) may perform a fade operation using the fade block 1404 and a time reverse operation using the time reverse block 1406 on the ideal impulse response 1420.

At 1604, an input signal is filtered with the modified impulse responses (see 1602) to generate an output signal.

For example, the filter bank 100 (see FIG. 1) may include a number of filters with the modified impulse responses generated at 1602, and may generate the output signal 106 from the input signal 104.

Figure 17:
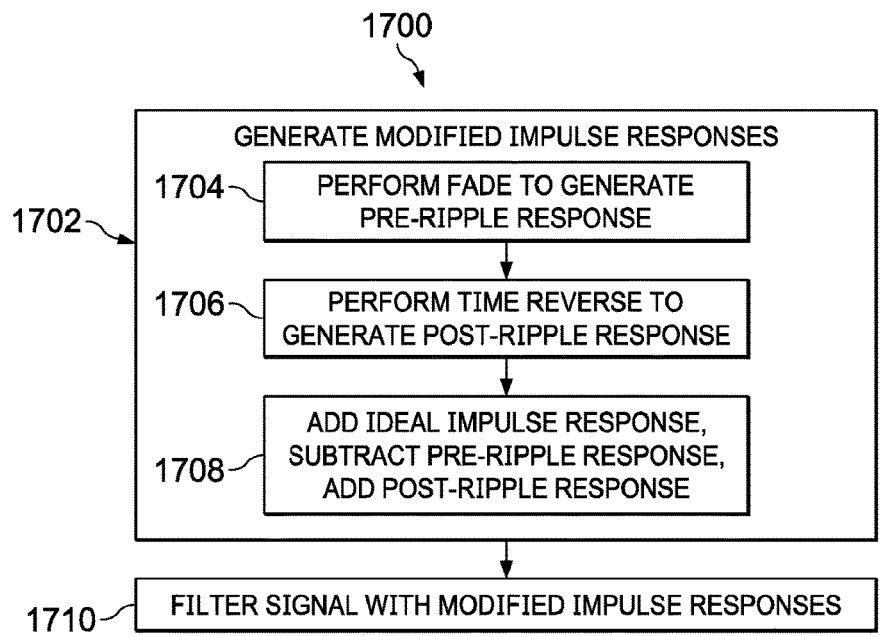
FIG. 17 is a flow diagram of a method 1700 of audio processing.
Figure 18:
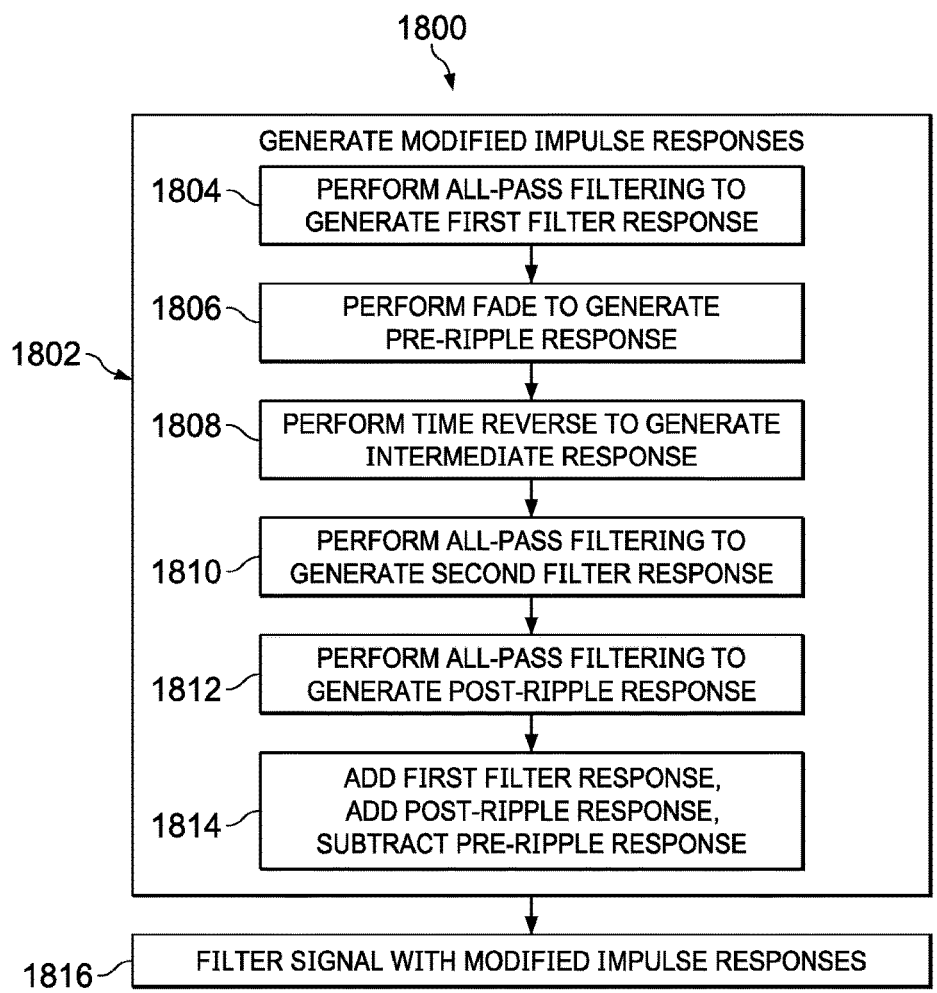
FIG. 18 is a flow diagram of a method 1800 of audio processing.

The general steps of the method 1600 are further detailed in FIGS. 17-18.

FIG. 17 is a flow diagram of a method 1700 of audio processing. The method 1700 may be implemented by a processor executing instructions e.g. according to one or more computer programs. The method 1700 is similar to the method 1600 (see FIG. 16) with more details specific to the operation of the method 1000 (see FIG. 10).

At 1702, modified impulse responses are generated from ideal impulse responses. This includes substeps 1704-1708.

At 1704, a pre-ripple response is generated based on a first ideal impulse response. For example, the fade block 1002 (see FIG. 10) may perform a fade operation on the ideal impulse response 1010 to generate the pre-ripple response 1012. See also Equation (18).

At 1706, a post-ripple response is generated based on the pre-ripple response. For example, the time reverse block 1004 (see FIG. 10) may perform a time reverse operation on the pre-ripple response 1012 to generate the post-ripple response 1014. See also Equation (20).

At 1708, a first modified impulse response is generated by adding the first ideal impulse response, subtracting the pre-ripple response, and adding the post-ripple response. For example, the summation block 1006 (see FIG. 10) may add the ideal impulse response 1010, subtract the pre-ripple response 1012, and add the post-ripple response 1014 to generate the filter response 1016. See also Equation (21).

At 1710, an input signal is filtered with the modified impulse responses (see 1702-1708) to generate an output signal. For example, the filter bank 100 (see FIG. 1) may include a number of filters with the modified impulse responses generated at 1702, and may generate the output signal 106 from the input signal 104.

FIG. 18 is a flow diagram of a method 1800 of audio processing. The method 1800 may be implemented by a processor executing instructions e.g. according to one or more computer programs. The method 1800 is similar to the method 1600 (see FIG. 16) with more details specific to the operation of the method 1400 (see FIG. 14).

At 1802, modified impulse responses are generated from ideal impulse responses. This includes substeps 1804-1814.

At 1804, a first filter response is generated based on a first ideal impulse response. For example, the all-pass filter 1402 (see FIG. 14) may perform an all-pass filter operation on the ideal impulse response 1420 to generate the filter response 1422. See also Equation (23).

At 1806, a pre-ripple response is generated based on the first filter response. For example, the fade block 1404 (see FIG. 14) may perform a fade operation on the filter response 1422 to generate the pre-ripple response 1424. See also Equation (24).

At 1808, an intermediate response is generated based on the pre-ripple response. For example, the time reverse block 1406 (see FIG. 14) may perform a time reverse operation on the pre-ripple response 1424 to generate the intermediate response 1426. See also Equation (26).

At 1810, a second filter response is generated based on the intermediate response. For example, the all-pass filter 1408 (see FIG. 14) may perform an all-pass filter operation on the intermediate response 1426 to generate the filter response 1428. See also Equation (27).

At 1812, a post-ripple response is generated based on the second filter response. For example, the all-pass filter 1410 (see FIG. 14) may perform an all-pass filter operation on the filter response 1428 to generate the post-ripple response 1430. See also Equation (27).

At 1814, a first modified impulse response is generated by adding the first filter response, adding the post-ripple response, and subtracting the pre-ripple response. For example, the summation block 1412 (see FIG. 14) may add the filter response 1422, add the post-ripple response 1430, and subtract the pre-ripple response 1424 to generate the filter response 1432. See also Equation (27).

At 1816, an input signal is filtered with the modified impulse responses (see 1802-1814) to generate an output signal. For example, the filter bank 100 (see FIG. 1) may include a number of filters with the modified impulse responses generated at 1802, and may generate the output signal 106 from the input signal 104.

In an embodiment, an input audio signal may be processed to produce an output audio signal where the gain of the processing at a number of predetermined frequencies is approximately equal to a corresponding set of gain coefficients. The processing may be implemented according to a filter response that is the weighted sum of a corresponding number of low-latency all-pass filter responses with the weightings being determined by the corresponding gain coefficients. The low-latency all-pass filter responses have been determined according to the method of FIG. 18.

In an alternative embodiment, an input audio signal is processed to produce an output audio signal, where the said output audio signal is formed by filtering said input audio signal by a total impulse response that is a weighted sum of a set of filter bank impulse responses. The sum of said filter bank impulse responses is an all-pass filter. The all-pass filter may have approximately constant phase response above a frequency of approximately 500 Hz, and a group-delay that rises at lower frequencies.

In an alternative embodiment, an input audio signal is processed to produce an output audio signal, where the said output audio signal is formed by filtering said input audio signal by a total impulse response that is a weighted sum of a set of filter bank impulse response. A reconstruction impulse response may be formed by the sum of the filter bank impulse responses such that the group delay of the reconstruction impulse response is approximately constant over a frequency range above 500 Hz and increases below 500 Hz. For example, the group delay may be perceptually constant above 500 Hz (varying by no more than 0.1 ms), and at lower frequencies, e.g., less than 500 Hz, may vary by less than 0.5/f seconds. The bandwidth of one or more impulse responses from said set of filter bank impulse responses may be narrower according to the increased group delay of the reconstruction impulse response.

Implementation Details

An embodiment may be implemented in hardware, executable modules stored on a computer readable medium, or a combination of both (e.g., programmable logic arrays). Unless otherwise specified, the steps executed by embodiments need not inherently be related to any particular computer or other apparatus, although they may be in certain embodiments. In particular, various general-purpose machines may be used with programs written in accordance with the teachings herein, or it may be more convenient to construct more specialized apparatus (e.g., integrated circuits) to perform the required method steps. Thus, embodiments may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein. (Software per se and intangible or transitory signals are excluded to the extent that they are unpatentable subject matter.)

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the disclosure as defined by the claims.

What is claimed is:

1. A method of audio processing, the method comprising:
   generating a plurality of modified impulse responses from a plurality of original impulse responses, wherein the plurality of original impulse responses respectively correspond to a plurality of frequencies, wherein generating the plurality of modified impulse responses includes:
   performing a fade operation and a time reverse operation on at least one of the plurality of original impulse responses;
   generating a pre-ripple response based on a first original impulse response;
   generating a post-ripple response based on the pre-ripple response; and
   adding the post-ripple response to the first original impulse response, and subtracting the pre-ripple response from the first original impulse response, to generate a first modified impulse response; and
   filtering an input signal with the plurality of modified impulse responses to generate an output signal.

2. The method of claim 1, wherein generating the pre-ripple response comprises:
   performing the fade operation on the first original impulse response to generate the pre-ripple response.

3. The method of claim 1, wherein generating the post-ripple response comprises:
   performing the time reverse operation on the pre-ripple response to generate the post-ripple response.

4. The method of claim 1, further comprising:
   generating a plurality of weighted modified impulse responses by applying a plurality of weights to the plurality of modified impulse responses,
   wherein filtering the input signal comprises filtering the input signal with the plurality of weighted modified impulse responses to generate the output signal.

5. The method of claim 4, wherein a reconstruction impulse response corresponds to a sum of the weighted modified impulse responses which has a group delay that is approximately constant over a frequency range above 500 Hz, and increases below 500 Hz.

6. The method of claim 4, wherein a bandwidth of at least one of the plurality of weighted modified impulse responses is narrower according to an increased group delay of the reconstruction impulse response.

7. The method of claim 4, wherein the plurality of weights are time varying.

8. The method of claim 1, wherein the input signal is one of a plurality of input signals, wherein the plurality of modified impulse responses are applied by a plurality of filter banks, wherein the output signal is one of a plurality of output signals, and wherein a given filter bank filters a given input signal to generate a given output signal.

9. A non-transitory computer readable medium storing a computer program that, when executed by a processor, controls an apparatus to execute processing including the method of claim 1.

10. The method of claim 1, wherein generating the plurality of modified impulse responses includes applying a weight to the at least one of the plurality of original impulse responses.

11. An apparatus for audio processing, the apparatus comprising:
    a processor; and
    a memory,
    wherein the processor is configured to control the apparatus to generate a plurality of modified impulse responses from a plurality of original impulse responses, wherein the plurality of original impulse responses respectively correspond to a plurality of frequencies, wherein generating the plurality of modified impulse responses includes:
    performing a fade operation and a time reverse operation on at least one of the plurality of original impulse responses;
    generating a pre-ripple response based on a first original impulse response;
    generating a post-ripple response based on the pre-ripple response; and
    adding the post-ripple response to the first original impulse response, and subtracting the pre-ripple response from the first original impulse response, to generate a first modified impulse response; and
    wherein the processor is configured to control the apparatus to filter an input signal with the plurality of modified impulse responses to generate an output signal.

12. The apparatus of claim 11, wherein generating the pre-ripple response comprises:
    performing the fade operation on the first original impulse response to generate the pre-ripple response.

13. The apparatus of claim 11, wherein generating the post-ripple response comprises:
    performing the time reverse operation on the pre-ripple response to generate the post-ripple response.

14. The apparatus of claim 11, wherein the processor is configured to control the apparatus to generate a plurality of weighted modified impulse responses by applying a plurality of weights to the plurality of modified impulse responses, and wherein the processor is configured to control the apparatus to filter the input signal with the plurality of weighted modified impulse responses to generate the output signal.

15. The apparatus of claim 14, wherein a reconstruction impulse response corresponds to a sum of the weighted modified impulse responses which has a group delay that is approximately constant over a frequency range above 500 Hz, and increases below 500 Hz.

16. The apparatus of claim 14, wherein a bandwidth of at least one of the plurality of weighted modified impulse responses is narrower according to an increased group delay of the reconstruction impulse response.

17. The apparatus of claim 14, wherein the plurality of weights are time varying.

18. The apparatus of claim 11, wherein the input signal is one of a plurality of input signals, wherein the plurality of modified impulse responses are applied by a plurality of filter banks, wherein the output signal is one of a plurality of output signals, and wherein a given filter bank filters a given input signal to generate a given output signal.

19. The apparatus of claim 11, wherein generating the plurality of modified impulse responses includes applying a weight to the at least one of the plurality of original impulse responses.

* * * * *